United States Patent
Yu et al.

(10) Patent No.: US 8,303,231 B2
(45) Date of Patent: Nov. 6, 2012

(54) APPARATUS AND METHOD FOR SEMICONDUCTOR WAFER TRANSFER

(75) Inventors: Yeh-Hsin Yu, Hsinchu County (TW); Jian-Hung Chen, Taipei County (TW); Chia Ho Chuang, Taoyuan County (TW); Hsueh Cheng Wu, Hsinchu (TW)

(73) Assignee: Taiwan Semiconductor Manufacturing Company Ltd., Hsinchu (TW)

( * ) Notice: Subject to any disclaimer, the term of this patent is extended or adjusted under 35 U.S.C. 154(b) by 637 days.

(21) Appl. No.: 11/864,469

(22) Filed: Sep. 28, 2007

(65) Prior Publication Data
US 2009/0087287 A1   Apr. 2, 2009

(51) Int. Cl.
*H01L 21/677* (2006.01)
(52) U.S. Cl. ............ 414/217; 414/416.03; 414/416.08; 414/811; 414/937; 414/940
(58) Field of Classification Search .............. 414/217, 414/217.1, 416.03, 416.08, 811, 937, 940
See application file for complete search history.

(56) References Cited

U.S. PATENT DOCUMENTS

| | | | | |
|---|---|---|---|---|
| 5,439,547 A | * | 8/1995 | Kumagai | 156/345.31 |
| 5,562,383 A | * | 10/1996 | Iwai et al. | 414/217.1 |
| 5,713,711 A | * | 2/1998 | McKenna et al. | 414/217.1 |
| 5,730,575 A | * | 3/1998 | Nichols et al. | 414/404 |
| 5,975,836 A | * | 11/1999 | Rodriguez | 414/787 |
| 7,077,614 B1 | * | 7/2006 | Hasper et al. | 414/217 |
| 2004/0126206 A1 | * | 7/2004 | Araya et al. | 414/217 |
| 2006/0188358 A1 | * | 8/2006 | Bonora et al. | 414/217 |
| 2006/0285944 A1 | * | 12/2006 | Evans | 414/217 |
| 2007/0183869 A1 | * | 8/2007 | Cho et al. | 414/217 |

* cited by examiner

*Primary Examiner* — Scott Lowe
(74) *Attorney, Agent, or Firm* — WPAT, P.C.; Anthony King

(57) ABSTRACT

An apparatus for semiconductor wafer transfer comprises a first region for placement of a pod, a second region for placement of a cassette, an unloading mechanism, and a transferring mechanism for transferring wafers in the unloaded pod to the cassette horizontally. In an embodiment, the pod is unloaded by lifting the housing of the pod, and preferably the apparatus for movement of semiconductor wafers further comprises a carrying mechanism for moving the cassette toward the pod, so that the cassette can be closer to the pod for smoothing wafer transfer.

10 Claims, 6 Drawing Sheets

APPARATUS AND METHOD FOR SEMICONDUCTOR WAFER TRANSFER

BACKGROUND OF THE INVENTION (A) Field of the Invention

The present invention relates to a method and an apparatus for semiconductor wafer transfer, and more specifically, to a method and an apparatus for semiconductor wafer transfer between a pod and a cassette.

(B) Description of Related Art

During the semiconductor manufacturing process, a cassette with wafers is disposed in a pod to prevent contamination especially while wafers are transferred between two processes. The pod may be equipped with a tag recording the lot number of the wafers for use in factory automation.

For some processes, the cassette has to withstand exposure to chemicals, e.g., photoresist removing in acid solution. During chemical mechanical polishing (CMP), e.g., in Mirra Mesa (a CMP tool of Applied Materials, Inc.), the wafers need to be put in water before being polished in order to avoid slurry crystallization. Accordingly, the wafers must be transferred from the original cassette to another cassette with different material, e.g., Teflon™ (polytetrafluoroethylene (PTFE)), before being processed.

Traditionally, in order to transfer the wafers in a pod to a cassette, the pod has to be unloaded by an auto loader unit (ALU) first, and then the user uses a suck pen to transfer wafers one by one. This requires a large amount of time and manpower.

In order to improve the efficiency of wafer transfer, a cassette-to-cassette (C-to-C) apparatus that can transfer a plurality of wafers at a time (batch wafer transfer) has been proposed. As shown in FIG. 1, a pod 11 is put on a platform 12 of an ALU 10. Generally, the pod 11 is composed of a base 112 and a transparent housing 111. A cassette 13 is placed on the base 112 and in the transparent housing 111. Two sides of the transparent housing 111 are equipped with handles 114, so that the user can take the pod 11 easily. Then, the cassette 13 with wafers is unlocked and unloaded from the pod 11 as shown in FIG. 2. The cassette 13 placed on the base 112 is lowered to the bottom of the ALU 10, while the transparent housing 111 is still on the platform 12. As a result, the user can take out the cassette 13 from the base 112. As shown in FIG. 3, the cassette 13 and an empty cassette 21 are placed on a C-to-C apparatus 20, and the openings of the cassette 13 and the empty cassette 21 face each other for wafer transfer therebetween. In this example, the cassette 21 is made of Teflon™ for CMP processing. A transfer robot 22 of the C-to-C apparatus 20 moves left so as to push the wafers in the cassette 13 toward the cassette 21. Accordingly, the wafers in the cassette 13 are transferred to the cassette 21 horizontally.

The traditional wafer transfer method between cassettes has many shortcomings. Because both the ALU and C-to-C apparatus need to be manually handled by the user, manpower is unavoidably wasted. In addition, the user needs to move the cassette including wafers from the ALU to C-to-C apparatus; during this period the wafers are not protected by the pod housing and are unavoidably exposed to air. Under such a situation, the wafers may be contaminated, damaged or otherwise scrapped due to incaution of the user.

SUMMARY OF THE INVENTION

The present invention provides an apparatus and a method for semiconductor wafer transfer, integrating the functions of pod unloading and cassette-to-cassette wafer transfer, so as to significantly decrease the manual work performed by the user. Accordingly, wafer contamination and wafer scrap can be avoided.

In accordance with the present invention, an apparatus for semiconductor wafer transfer comprises a first region for placement of a pod, a second region for placement of a cassette, an unloading mechanism for unloading the pod, and a transferring mechanism for transferring at least one wafer in the unloaded pod to the cassette automatically. In an embodiment, the pod is unloaded by lifting the housing of the pod, and preferably the apparatus for semiconductor wafer transfer further comprises a carrying mechanism for moving the cassette toward the pod, so that the cassette can be closer to the pod for smoothing wafer transfer.

As such, a pod is placed on a first region and a cassette is placed on a second region at the beginning and then the pod is unloaded by lifting the housing of the pod. As a result, the wafers in the pod are not covered by the housing, so that the wafers in the unloaded pod can be transferred to the cassette horizontally.

BRIEF DESCRIPTION OF THE DRAWINGS

The advantages of the present invention will become apparent upon reading the following description and upon reference to the accompanying drawings in which.

DETAILED DESCRIPTION OF THE INVENTION

Figure 1:
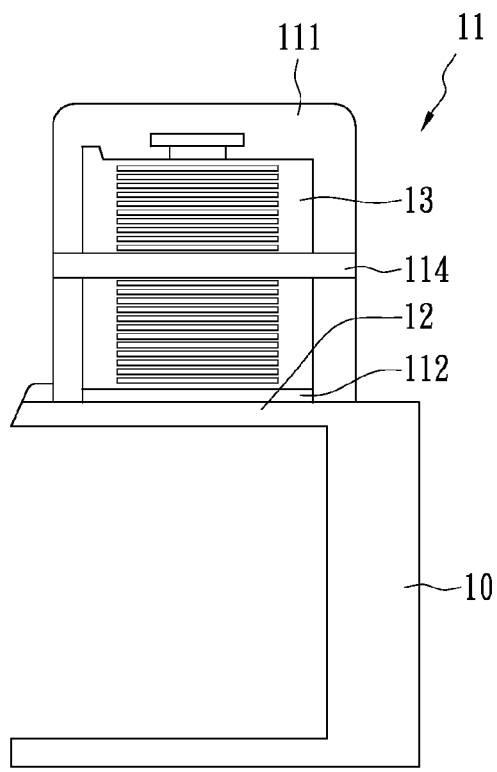
FIGS. 1 and 2 illustrate operations of a known auto loader unit.
Figure 2:
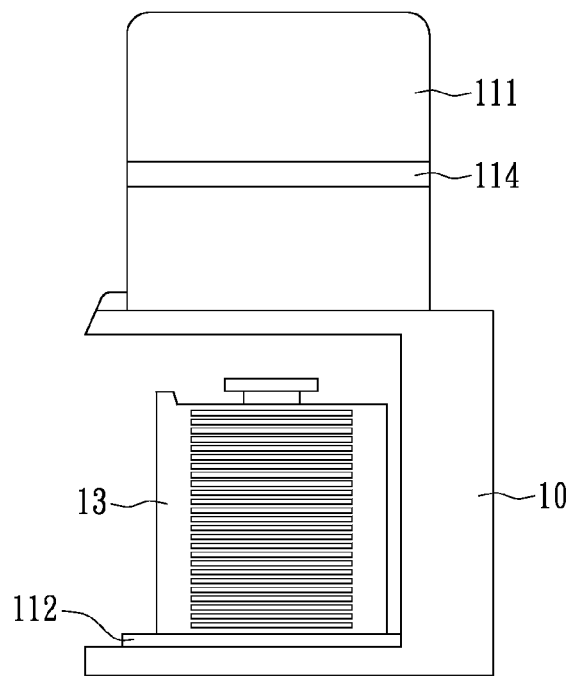
Figure 3:
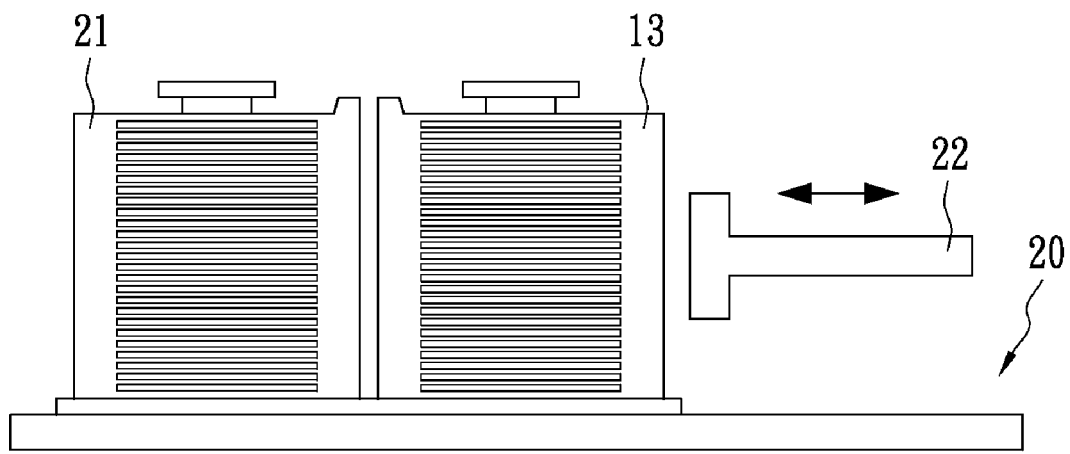
FIG. 3 illustrates a known cassette-to-cassette apparatus.
Figure 4:
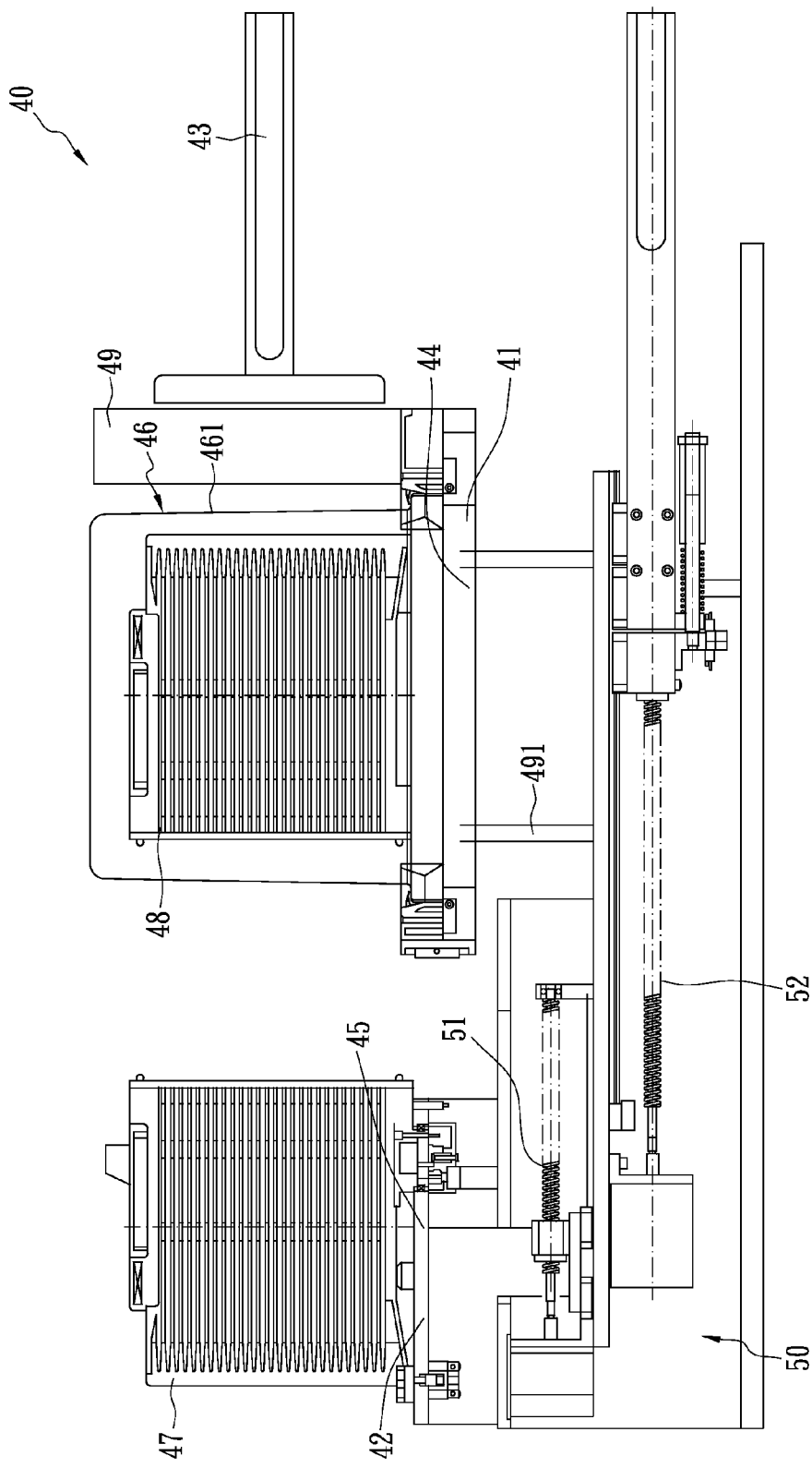
FIGS. 4 and 5 illustrate the apparatus for semiconductor wafer transfer in accordance with an embodiment of the present invention.

FIG. 4 illustrates an apparatus for wafer transfer in accordance with an embodiment of the present invention. An apparatus for wafer transfer 40 comprises a first stage 41, a second stage 42 and a transferring mechanism. The transferring mechanism, such as a robot arm 43 is configured to transfer at least one wafer in an unloaded pod to its corresponding cassette automatically. The first stage 41 has a first region 44 thereon for placement of a pod 46 including a cassette 48, whereas the second stage 42 has a second region 45 for placement of a cassette 47. The pod 46 is supported by rods 491. In this embodiment, the cassette 47 is made of polytetrafluoroethylene (PTFE), i.e., Teflon™, for use in CMP processing or wet chemical tools. The cassette 47 can be empty for batch wafer transfer or partial empty of wafer as desired. The first region 44 and second region 45 are arranged to have the cassettes 47 and 48 on a same horizontal plane, so that the wafers in the cassette 48 can be transferred to the cassette 47 horizontally.

Figure 5:
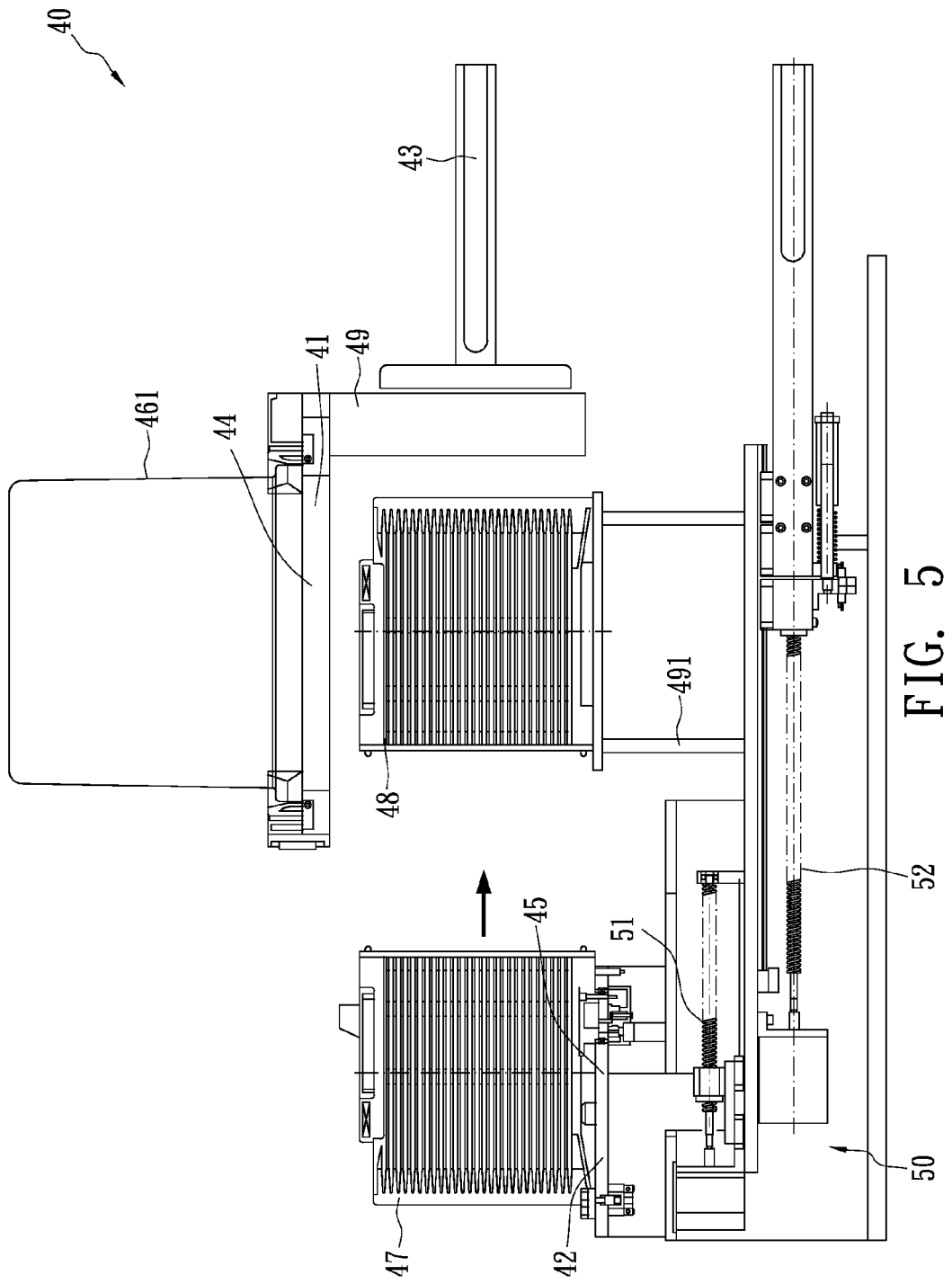

The apparatus 40 further comprises an unloading mechanism 49 for unloading the pod that is configured to unlock the pod 46 and lift the housing 461 of the pod 46, i.e., unloading the pod 46. FIG. 5 illustrates the status of the apparatus 40 after the pod 46 is unloaded, i.e., the situation after the housing 461 is lifted.

Preferably, the apparatus for wafer transfer 40 further comprises a carrying mechanism 50 for moving the cassette, so that the cassette 47 can be moved toward the corresponding cassette 48 before wafer transfer. Consequently, the wafers in the cassette 48 can be smoothly transferred to the cassette 47. If the distance between the cassettes 47 and 48 is too far, the wafers being moved out of the cassette 48 may be tilted due to gravity, or misalignment may occur due to the variations between different cassettes, resulting in wafer transfer problem. In an embodiment, the carrying mechanism 50 for moving the cassette comprises screws 51 and 52 being capable to move the second stage 42 right, so that the cassette 47 on the second stage 42 can be moved right toward the cassette 48. The screw 51 is in connection with the second stage 42, so that the second stage 42 can be moved horizontally by rotating the screw 51. The screw 52 is in connection with the stage carrying the screw 51, so that the screw 51 can be moved horizontally by rotating the screw 52. As such, the screw 51 can fine-tune and the screw 52 can coarse-tune the movement of the cassette 47.

Figure 6:
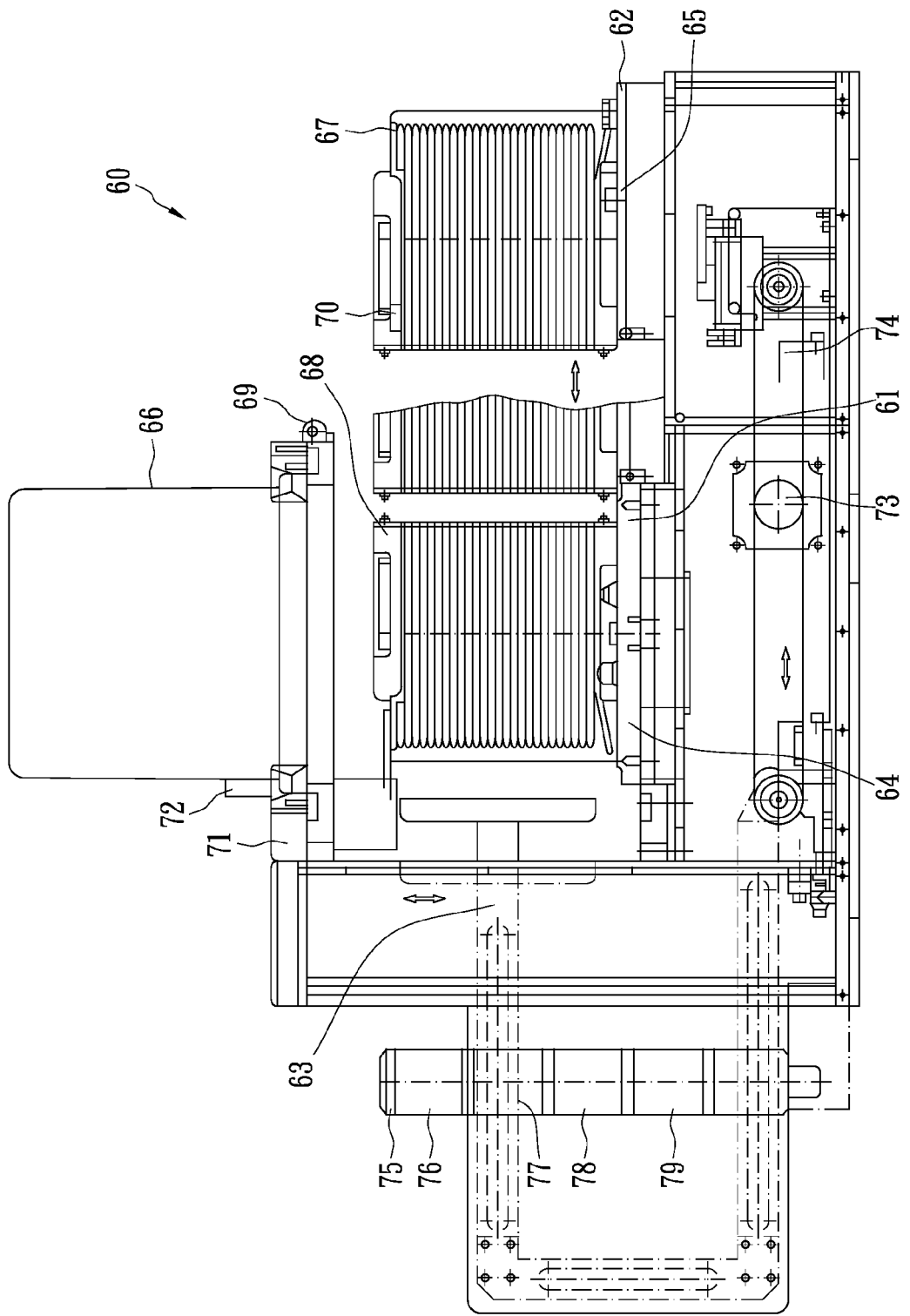
FIG. 6 illustrates the apparatus for semiconductor wafer transfer in accordance with another embodiment of the present invention.

FIG. 6 illustrates an apparatus 60 for semiconductor wafer transfer in accordance with another embodiment of the present invention. The apparatus 60 comprises a first stage 61, a second stage 62 and a transferring mechanism 63. The transferring mechanism 63 such as a robot arm 63 is configured to transfer at least one wafer in an unloaded pod to its corresponding cassette automatically. The first stage 61 has a first region 64 thereon for placement of a pod 66 that can accommodate a cassette 68, whereas the second stage 62 has a second region 65 for placement of a cassette 67. In this embodiment, the cassette 67 is made of polytetrafluoroethylene (PTFE), i.e., Teflon™, for use in CMP processing or wet chemical tools. The cassette 67 can be empty for batch wafer transfer or partial empty of wafer as desired. The first region 64 and second region 65 are arranged to have the cassettes 67 and 68 on a same horizontal plane, so that the wafers in the cassette 68 can be transferred to the cassette 67 horizontally.

In this embodiment, many devices are further added for automation of manufacturing. The pod 66 has a RFID reader 69, so as to read the cassette ID recorded in an electronic tag 70 of the cassette 67, and transmit the cassette ID to the Computer Integrated Manufacturing (CIM) system. In a preferred embodiment, a tag reader 71 is placed in front of on the pod 66 to read the lot information recorded in another electronic tag 72 of the pod 66. Consequently, the cassette ID of the cassette 67 is automatically linked to the lot information of the pod 66. In such way, the likelihood of erroneous mapping data between the two cassettes 67 and 68, which may be caused by manual operation, can be significantly reduced. The second stage 62 is equipped with a lock/unlock mechanism to secure the cassette 67 while transferring wafers. Like the cassette 47 of the embodiment illustrated in FIGS. 4 and 5, the cassette 67 can also be moved forward to be closer to the cassette 68 before wafer transferring. In this embodiment, the cassette 67 is moved by a conveyer 74. In this embodiment, the conveyer 74 is driven by a belt. In addition to the screw mechanism or belt conveyer, other known mechanisms by those skilled in the art, such as a hydraulic or pneumatic mechanism, are applicable also.

In the present embodiment, the apparatus 60 provides some mechanisms for safety concern. An emergency off (EMO) button 73 is provided. The user can push the EMO button 73 to immediately cut off power if an abnormal or emergency issue occurs. Moreover, a tower indicator 75 showing four colors is provided to indicate the operation status of the apparatus 60. The tower indicator 75 comprises, from top to bottom, a red light 76, an orange light 77, a green light 78 and a blue light 79.

The apparatus 60 is linked to the CIM system, and the user controls the apparatus 60 through a graphic user interface (GUI). The wafer transfer can be divided into four periods at which the tower indicator shows four different colors. The green light 78, the blue light 79, the orange light 77 and the red light 76 indicate idle, ready, transferring and alarm statuses, respectively.

In "green" period: When the pod 66 is placed in the first stage 61, the tag reader 71 reads the lot information of the pod 66, and the GUI shows that the pod 66 is ready and requests the user to put a cassette at the second stage 62. The tower indicator 75 shows green, i.e., the green light 78 is "on", during this period.

In "blue" period: In the case that the cassette 67 is taken from a CMP tool, the cassette 67 has to be dried before being put in the second stage 62. After the cassette 67 is placed in the second stage 62, the tower indicator 75 shows "blue," and the barcode on the cassette 67 is detected by an optical detector handled by a user, or the electronic tag 70 is detected by the RFID detector 69 automatically, so as to obtain the cassette ID of the cassette 67. As a result, the CIM system can record and establish the relation between the lot information of the pod 66 and the corresponding cassette ID of the cassette 67.

In "yellow" period: The pod 66 and the cassette 67 are locked. The pod cover is lifted, and the cassette 67 moves close to the cassette 68 originally placed in the pod cover. Afterwards, the wafers in the cassette 68 are transferred to the cassette 67 by the transferring mechanism 63. The "yellow" light expresses a warning to tell the user do not touch the apparatus 60.

In "red" period: The apparatus is alarmed due to abnormal issues. For instance, the belt for moving the cassette is broken, stuck or damaged; the stage 61, 62, the cassette 67 or 68 is hit by external forces resulting in abnormal movement; the cassette 67 or 68 is placed abnormally; or the operation does not complete in a predetermined time period. In an embodiment, in addition to that the red light 76 is on when abnormal issues occur, a beeper sounds as well, and the apparatus 60 is stopped automatically.

If the wafers are transferred normally and smoothly, the pod cover moves downward and the pod 66 is locked and the blue light is "on" again. The pod 66 and the cassette 67 are unlocked afterwards, and therefore can be taken out by the user.

According to well-known theories of industrial engineering, "eliminate, combine, reset and simplify" are four rules to improve manufacturing efficiency. As to "eliminate," the manual operation to move the cassette between ALU and C-to-C apparatus is eliminated. As to "combine," the pod unloading and the wafer transfer are combined, i.e., ALU and C-to-C apparatus are integrated. As to "reset," the wafers are transferred to a cassette after unloading. As to "simplify," because most of the manual operations for wafer transfer are canceled, the user needs only to put the pod and the cassette in correct places, and other procedures can be conducted by the integral apparatus automatically. The apparatus 40 takes only 7 to 10 seconds for all the procedures of wafer transfer. Moreover, the workload for the users (operators) can be significantly decreased.

Figure 7:
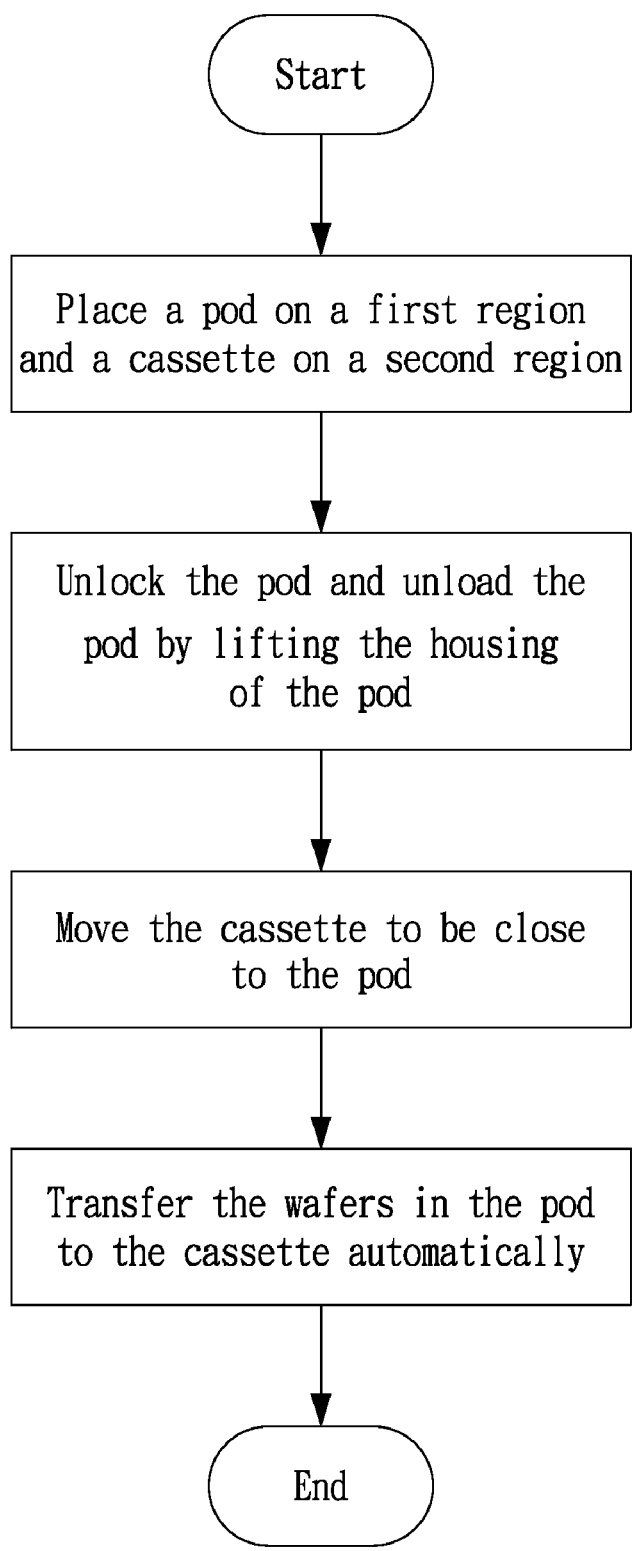
FIG. 7 illustrates the flow chart for semiconductor wafer transfer in accordance with the present invention.

The wafer transfer method in accordance with one embodiment of the present invention can be summarized in FIG. 7. First, a pod having a cassette is put on a first region and a corresponding cassette is put on a second region. The cassette in the pod and the corresponding cassette on the second region are on the same horizontal plane. Next, the pod is unlocked, and is unloaded by lifting the housing of the pod. Preferably, the corresponding cassette is moved as close to the cassette of the pod as possible so that these two cassettes can exactly face each other for smoothing the action of wafer transfer. Lastly, the wafers in the pod are transferred to the corresponding cassette horizontally.

In accordance with the apparatus and method for the wafer transfer of the present invention, the manual operations are tremendously reduced so that potential wafer damage due to incaution of the user can be reduced to the minimum. In addition, the wafers after unloading are transferred to the corresponding cassette directly, so that the contamination of the wafers can be reduced to the minimum as well.

The above-described embodiments of the present invention are intended to be illustratively only. Numerous alternative embodiments may be devised by those skilled in the art without departing from the scope of the following claims.

What is claimed is:

1. An apparatus for semiconductor wafer transfer, comprising:
    a first region for placement of at least one pod having a cassette, wherein the cassette carries wafers;
    a second region for placement of a corresponding cassette;
    a first stage;
    a second stage coupled to the first stage;
    a carrying mechanism coupled to the first stage configured to move the second stage in the horizontal direction toward the first stage;
    a third stage coupled to the second stage, wherein the carrying mechanism has a first screw drive to coarsely move the third stage together with the second stage in the horizontal direction, and a second screw drive to finely move the second stage in the horizontal direction independently and relatively to the third stage;
    an unloading mechanism coupled to the first stage configured to unload the pod;
    a push bar coupled to the first stage configured to abut against at least one wafer in a horizontal direction in the unloaded pod to transfer the at least one wafer to the corresponding cassette;
    wherein the cassette in the first region and the corresponding cassette in the second region are on the same horizontal plane; and
    wherein the first region is disposed on the first stage and the second region is disposed on the second stage, and
    wherein the second stage is movable in the horizontal direction so as to provide a distance away from the first stage to allow the unloading mechanism to unload a housing of the pod in a vertical direction when the cassette is on the first stage, and when the corresponding cassette is on the second stage concurrently.

2. The apparatus for semiconductor wafer transfer in accordance with claim 1, wherein openings of the cassette of the unloaded pod on the first region and the corresponding cassette on the second region face each other.

3. The apparatus for semiconductor wafer transfer in accordance with claim 1, wherein the cassette is for use in chemical mechanical polishing.

4. The apparatus for semiconductor wafer transfer in accordance with claim 1, wherein the cassette is for use in wet chemical tools.

5. The apparatus for semiconductor wafer transfer in accordance with claim 1, wherein the cassette is made of polytetrafluoroethylene.

6. The apparatus for semiconductor wafer transfer in accordance with claim 1, wherein the corresponding cassette is empty before wafer transfer.

7. The apparatus for semiconductor wafer transfer in accordance with claim 1, wherein the carrying mechanism has at least one screw drive.

8. A method for semiconductor wafer transfer, comprising:
    providing an apparatus having a first and second stage comprising:
    a first region to hold a pod having a cassette;
    a second region for placement of a corresponding cassette;
    a first stage having said first region;
    a second stage having said second region, and is coupled to the first stage;
    an unloading mechanism coupled to the first stage configured to unload a pod;
    a push bar coupled to the first stage configured to abut against at least one wafer to the corresponding cassette in a horizontal direction; and
    a carrying mechanism coupled to the first stage to move the second stage in the horizontal direction toward the first stage;
    a third stage coupled to the second stage, wherein the carrying mechanism has a first screw drive to coarsely move the third stage together with the second stage in the horizontal direction, and a second screw drive to finely move the second stage in the horizontal direction independently and relatively to the third stage;
    placing the pod having the cassette on the first region and the corresponding cassette on the second region, wherein the cassette in the pod carries said at least one wafer;
    unloading the pod by removing a housing of said pod, while the cassette is on the first stage, and while the corresponding cassette is on the second stage;
    carrying the second stage toward the first stage in a horizontal direction; and
moving the push bar toward the cassette to transfer said at least one wafer in the pod to the corresponding cassette;
    wherein the cassette in the first region and the corresponding cassette in the second region are on a same horizontal plane.

9. The method for semiconductor wafer transfer in accordance with claim 8, wherein the pod is unloaded by lifting a housing of the pod in a vertical direction.

10. The method for semiconductor wafer transfer in accordance with claim 8, wherein the step of moving the second stage effectively moves said corresponding cassette toward the pod before transferring at least one wafer in the pod to be unloaded to the corresponding cassette.

* * * * *